United States Patent
Seol et al.

(10) Patent No.: US 7,501,680 B2
(45) Date of Patent: Mar. 10, 2009

(54) MEMORY DEVICE HAVING NANOCRYSTALS IN MEMORY CELL

(75) Inventors: Kwang-soo Seol, Yongin-si (KR); Seong-jae Choi, Yongin-si (KR); Jae-young Choi, Yongin-si (KR); Yo-sep Min, Yongin-si (KR); Eun-joo Jang, Yongin-si (KR); Dong-kee Yi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/711,714

(22) Filed: Feb. 28, 2007

(65) Prior Publication Data

US 2007/0257297 A1    Nov. 8, 2007

(30) Foreign Application Priority Data

Feb. 28, 2006    (KR) ...................... 10-2006-0019301

(51) Int. Cl.
*H01L 21/336*    (2006.01)
(52) U.S. Cl. .............................. 257/316; 257/E27.078; 257/E29.3; 977/721; 977/785; 977/943; 438/261; 438/264
(58) Field of Classification Search ................. 438/261, 438/264; 257/315, 325
See application file for complete search history.

(56) References Cited

U.S. PATENT DOCUMENTS

| | | | |
|---|---|---|---|
| 5,997,958 A * | 12/1999 | Sato et al. .................... 427/468 |
| 6,753,568 B1 * | 6/2004 | Nakazato et al. ............. 257/314 |
| 7,208,793 B2 * | 4/2007 | Bhattacharyya ............. 257/314 |
| 2004/0213986 A1 * | 10/2004 | Kim et al. ................. 428/315.7 |
| 2005/0032268 A1 * | 2/2005 | Nishikawa et al. ............ 438/99 |
| 2005/0072989 A1 * | 4/2005 | Bawendi et al. ............. 257/200 |
| 2006/0040103 A1 * | 2/2006 | Whiteford et al. ........... 428/403 |
| 2006/0046384 A1 * | 3/2006 | Joo et al. .................... 438/257 |

* cited by examiner

*Primary Examiner*—Michelle Estrada
*Assistant Examiner*—Kevin A Parendo
(74) *Attorney, Agent, or Firm*—Harness, Dickey & Pierce, P.L.C.

(57) ABSTRACT

The memory device includes a source region and a drain region in a substrate and spaced apart from each other; a memory cell formed on a surface of the substrate, wherein the memory cell connects the source region and the drain region and includes a plurality of nanocrystals; a control gate formed on the memory cell. The memory cell includes a first tunneling oxide layer formed on the substrate; a second tunneling oxide layer formed on the first tunneling oxide layer; and a control oxide layer formed on the second tunneling oxide layer. The control oxide layer includes the nanocrystals. The second tunneling oxide layer, having an aminosilane group the increases electrostatic attraction, may be hydrophilic, enabling the formation of a monolayer of the nanocrystals.

13 Claims, 11 Drawing Sheets

MEMORY DEVICE HAVING NANOCRYSTALS IN MEMORY CELL

PRIORITY STATEMENT

This application claims the benefit of priority under 35 U.S.C. §119 from Korean Patent Application No. 10-2006-0019301, filed on Feb. 28, 2006 in the Korean Intellectual Property Office, the disclosure of which is incorporated herein by reference in its entirety.

BACKGROUND

1. Field

Example embodiments relate to a memory device and a method of manufacturing the same. Other example embodiments relate to a memory device including a hydrophilic second tunneling oxide layer and nanocrystals and a method of manufacturing the same.

2. Description of the Related Art

A memory device using a semiconductor includes a transistor and a capacitor. The transistor functions as a switch that provides a path for a current when recording or reading information. The transistor is placed in the capacitor. The capacitor preserves stored charges.

A substantially high transconductance is necessary in order for the transistor to allow a substantially large amount of current to flow through. As such, a metal oxide semiconductor field effect transistor (MOSFET) having a substantially high transconductance is used as a switching device of a semiconductor memory device. The MOSFET includes a gate electrode, source electrodes and drain electrodes. The gate electrode is formed of multi-crystalline silicon. The source and drain electrodes are formed of doped crystalline silicon.

As information devices develop, there has been an increase in research focused on developing smaller, highly-integrated memory devices (e.g., devices in which the number of integrated memory devices per unit area is increased). If such highly-integrated memory devices are used, then the signal transmission time between devices is reduced. As such, a larger amount of information is processed at a higher speed.

In a conventional MOSFET, a larger amount of heat is generated. As such, if the integration of the memory device increases, then the device may melt or malfunction.

A single electron device (SED) has been developed. Theoretically, a SED uses electrical signals by transmitting one electron. As such, a device is required to more precisely control the transmission of the electron. A nanocrystal may be used to control the transmission of the electron.

The nanocrystal may be formed of a metal or semiconductor that has a smaller size than a Bohr exiton diameter (e.g., a few nanometers). A nanocrystal has a large number of electrons, yet the number of free electrons is limited to about 1-100.

The energy potential of the electrons in a nanocrystal is limited. As such, a nanocrystal shows different electrical and/or optical properties than a nanocrystal formed of a metal or semiconductor in a bulk state, which forms a continuous band.

Conventionally, various conductors and nonconductors are mixed in order to obtain semiconductors having a desired band gap. Nanocrystals have different energy potentials which vary according to the size of nanocrystals. The band gap may be controlled by changing the size of the nanocrystals.

Unlike a bulk-type semiconductor, the amount of energy needed for adding electrons is not uniform but varies in a stepwise manner. A Coulomb blockade effect, in which the present of an existing electron disturbs the addition of new electrons, may occur.

If there are a desired number of electrons needed for crystals, then the transfer of additional electrons by tunneling is blocked. If the size of the nanocrystals is less than 10 nm, then theoretically a single electron can be transferred. Because the number of transferred electrons is smaller, the amount of heat generated is also smaller. Because less heat is generated, smaller device can be manufactured.

The nanocrystals may be used in smaller devices if used with a transistor. Research has been conducted on memory devices having nanocrystals.

Conventional nanocrystals used in memory devices are manufactured by heat treatment. Nanocrystals having a higher melting point may not be treated with heat. The size of the nanocrystals manufactured by heat treatment is not uniform. Nanocrystals that are not uniform deteriorate characteristics of the memory device.

SUMMARY

Example embodiments relate to a memory device and a method of manufacturing the same. Other example embodiments relate to a memory device including a hydrophilic second tunneling oxide layer and nanocrystals and a method of manufacturing the same.

Example embodiments provide a memory device in which nanocrystals of a monolayer are dispersed and arranged on a tunneling oxide layer.

According to example embodiments, there is provided a memory device including a source and drain region, a memory cell having a plurality of nanocrystals, and a control gate. The control gate is on the memory cell. The source region and drain region are in a substrate and spaced apart from each other. The memory cell is on a surface of the substrate. The memory cell connects the source region and the drain region. The memory cell also includes a first tunneling oxide layer on the substrate; a second tunneling oxide layer on the first tunneling oxide layer; and a control oxide layer on the second tunneling oxide layer over the nanocrystals.

The memory device includes an amino organic silane layer on the second tunneling oxide layer. The amino organic silane layer may be formed of an amino organic silane represented by Formula (1):

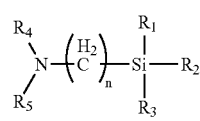

FORMULA (1)

wherein $R_1$, $R_2$, and $R_3$ are each independently a hydrogen atom, a halogen atom, a $C_{1-5}$ alkyl group or a $C_{1-5}$ alkoxy group, and at least one of $R_1$, $R_2$, and $R_3$ is a halogen atom or a $C_{1-5}$ alkoxy group; $R_4$ and $R_5$ are each independently a hydrogen atom, $NH_2CH_2CH_2-(NHCH_2CH_2)_x-$, an aliphatic alkyl group including at least one nitrogen atom, or a cyclo alkyl including at least one nitrogen atom, where x is an integer from 0 to 10; and n is an integer from 3 to 20.

The first tunneling oxide layer is formed of a material having a higher dielectric constant than the second tunneling oxide layer. The first tunneling oxide layer is at least one material selected from the group consisting of lanthanum oxide, transition oxide, silicon lanthanum oxide, lanthanum oxide nitride and transition oxide nitride. The first tunneling oxide layer may be at least one material selected from the group consisting of $HfO_2$, $ZrO_2$, $HfO_xN_y$, $ZrO_xN_y$, $TiO_2$, $Ta_2O_5$, $La_2O_3$ and $PrO_2$.

The second tunneling oxide layer may be formed of at least one material selected from the group consisting of $Al_2O_3$, $SiO_2$, $SiO_xN_y$, silicate of a lanthanoid metal and aluminate of a lanthanoid metal. The thickness of the second tunneling oxide layer is 0.5 nm to 2 nm. The water contact angle of the second tunneling oxide layer is less than 50 degrees.

The memory device may include a third tunneling oxide layer between the substrate and the first tunneling oxide layer. The third tunneling oxide layer may be formed of $SiO_2$.

The nanocrystals may be selected from the group consisting of metal nanoparticles including Pt, Pd, Co, Cu, Mo, Ni, Fe, Group II-VI compound semiconductor nanoparticles including CdS, CdSe, CdTe, ZnS, ZnSe, ZnTe, HgS, HgSe, HgTe, Group III-V compound semiconductor nanoparticles including GaN, GaP, GaAs, InP, InAs and Group IV-VI compound semiconductor nanoparticles including PbS, PbSe, PbTe. The nanocrystals may be formed of a metal or alloy. The nanocrystals may have a core-shell structure and a size of 10 nm or less. The nanocrystals included in the control oxide layer may be arranged as a monolayer.

According to example embodiments, there is provided a method of manufacturing a memory device including forming a first tunneling oxide layer on a surface of the substrate; forming a second tunneling oxide layer on the first tunneling oxide layer; forming an amino organic silane layer on a surface of the second tunneling oxide layer; forming nanocrystals on the amino organic silane layer and forming a control oxide layer on the surface of the second tunneling oxide layer over the nanocrystals.

The method may include forming source and drain regions on the surface of the substrate; and forming a control gate on a surface of the control oxide layer. The source and drain regions may be formed prior to forming the first tunneling oxide layer or after forming the control oxide layer.

The amino organic silane layer may be formed of an amino organic silane layer is represented by Formula 1:

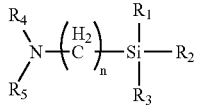

FORMULA (1)

wherein $R_1$, $R_2$, and $R_3$ are each independently hydrogen atom, a halogen atom, a $C_{1-5}$ alkyl group, or a $C_{1-5}$ alkoxy group, and at least one of $R_1$, $R_2$, and $R_3$ is a halogen atom or a $C_{1-5}$ alkoxy group; $R_4$ and $R_5$ are each independently a hydrogen atom, $NH_2CH_2CH_2$—$(NHCH_2CH_2)_x$—, an aliphatic alkyl group including at least one nitrogen atom, or a cycloalkyl group including at least one nitrogen atom, where x is an integer from 0 to 10; and n is an integer from 3 to 20.

The second tunneling oxide layer may be formed of at least one material selected from the group consisting of $Al_2O_3$, $SiO_2$, $SiO_xN_y$, silicate of a lanthanoid metal, and aluminate of a lanthanoid metal. The thickness of the second tunneling oxide layer is 0.5 nm to 2 nm. The water contact angle of the second tunneling oxide layer is less than 50 degrees.

The first tunneling oxide layer is formed of a material having a higher dielectric constant than the second tunneling oxide layer. The first tunneling oxide layer may be at least one material selected from the group consisting of silicon lanthanum oxide and lanthanum oxide nitride. The first tunneling oxide layer may be formed of at least one material selected from the group consisting of $HfO_2$, $ZrO_2$, $HfO_xN_y$, $ZrO_xN_y$, $TiO_2$, $Ta_2O_5$, $La_2O_3$ and $PrO_2$.

A third tunneling oxide layer may be formed between the substrate and the first tunneling oxide layer. The third tunneling oxide layer may be formed of $SiO_2$.

The nanocrystals may be capped by a polar organic molecule. The nanocrystals may be formed (or arranged) on the amino organic silane layer by spin-coating, dip coating, or drop casting. The nanocrystals, in the control oxide layer, may be arranged as a monolayer.

The nanocrystals may be selected from the group consisting of metal nanoparticles comprising Pt, Pd, Co, Cu, Mo, Ni, Fe, Group II-VI compound semiconductor nanoparticles including CdS, CdSe, CdTe, ZnS, ZnSe, ZnTe, HgS, HgSe, HgTe, Group III-V compound semiconductor nanoparticles including GaN, GaP, GaAs, InP, InAs, and Group IV-VI compound semiconductor nanoparticles including PbS, PbSe, PbTe. The nanocrystals may be formed of a metal or alloy. The nanocrystals may have a core-shell structure or a size of 10 nm or less.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein.

FIG. 1 is a diagram illustrating a cross-sectional view of a memory device according to example embodiments;

FIG. 4 is a scanning electron microscope (SEM) photograph showing nanocrystals arranged on a surface of a second tunneling oxide layer manufactured according to Example 1;

FIG. 5 is a SEM photograph showing nanocrystals arranged on a surface of a second tunneling oxide layer manufactured according to Example 2;

FIG. 6 is a SEM photograph showing nanocrystals arranged on a surface of a first tunneling oxide layer manufactured according to Comparative Example 1;

FIG. 7 is a graph illustrating the variation of a flat band voltage VFB according to programming time and erasing time of a memory device manufactured according to Example 1;

FIG. 8 is a graph illustrating the predicted data storing time of a memory device manufactured according to Example 1; and FIGS. 9 and 10 are SEM photographs showing the arrangement of palladium (Pd) nanocrystals that are capped with oleyl amine and spin-coated on a surface of a first tunneling oxide layer formed of hafnium oxide ($HfO_2$).

DETAILED DESCRIPTION

Figure 1:
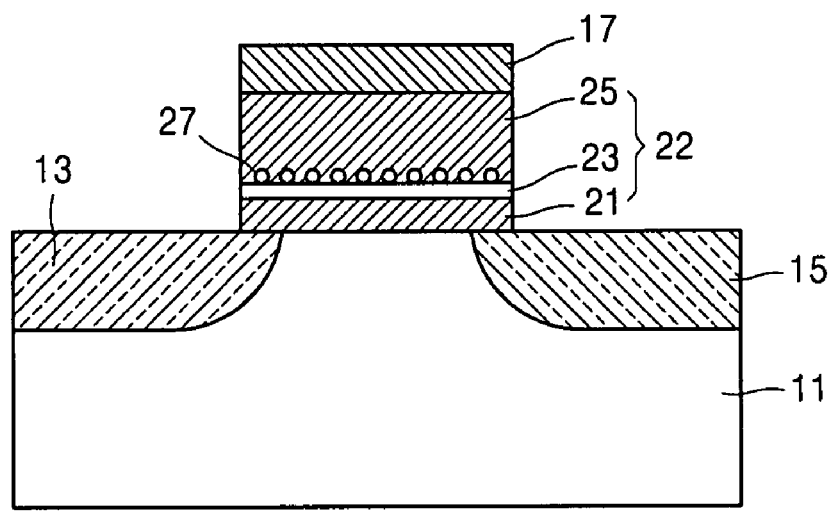

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the accompanying drawings. However, the present invention is not limited to the example embodiments described.

Example embodiments relate to a memory device and a method of manufacturing the same. Other example embodiments relate to a memory device including a hydrophilic second tunneling oxide layer and nanocrystals and a method of manufacturing the same.

FIG. 1 is a diagram illustrating a cross-sectional view of a memory device including nanocrystals according to example embodiments.

Referring to FIG. 1, memory device 10 includes a source region 13 and a drain region 15 formed in a substrate 11, a memory cell 22 formed on a surface of the substrate 11 and a control gate 17 formed on the memory cell 22. The source region 13 and the drain region 15 may be formed to a desired depth. The source region 13 and the drain region 15 may be spaced apart from each other. The memory cell 22 connects the source region 13 and the drain region 15. The memory cell 22 includes a plurality of nanocrystals 27.

The control gate 17 controls the number of electrons stored in the memory cell 22.

The substrate 11 may be a semiconductor substrate formed of silicon.

The source region 13 and the drain region 15 may be formed as an n-type or p-type region using conventional semiconductor processes (e.g., performing a diffusion process after a doping process).

The memory cell 22 includes a first tunneling oxide layer 21 formed on the substrate 11, a second tunneling oxide layer 23 formed on the first tunneling oxide layer 21 and a control oxide layer 25 formed on the second tunneling oxide layer 23. Electrons pass through the first tunneling oxide layer 21 and the second tunneling oxide layer 23. The control oxide layer 25 includes the plurality of nanocrystals 27.

The first tunneling oxide layer 21 is formed of a material having a higher dielectric constant than the second tunneling oxide layer 23. The first tunneling oxide layer 21 and second tunneling oxide layer 23 have a dielectric constant k of 7 to 100.

According to example embodiments, if the second tunneling oxide layer 23 is formed on the first tunneling oxide layer 21, aminosilane (not shown) is introduced to a surface of the second tunneling oxide layer 23 to provide an electrostatic attraction. The aminosilane could be introduced (or provided) in the form of an amino organic silane layer (not shown). The silane layer may be formed on a surface of the second tunneling oxide layer 23 using a wet synthesizing process. The second tunneling oxide layer 23 is more reactive to a silane group than the first tunneling oxide layer 21.

The nanocrystals 27 may be in the form of colloid and have a polarity. As such, the nanocrystals 27 may be arranged (or more uniformly coated) on the silane layer as a dense and uniform monolayer due to the electrostatic attraction.

According to example embodiments, the aminosilane is more reactive to the second tunneling oxide layer 23. As such, charges may be more sufficiently formed on the second tunneling oxide layer 23 to induce electrostatic attraction.

Figure 9:
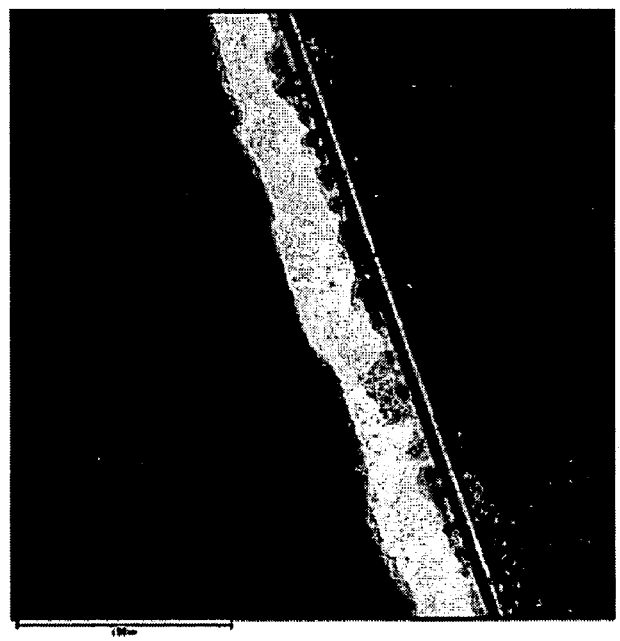
Figure 10:
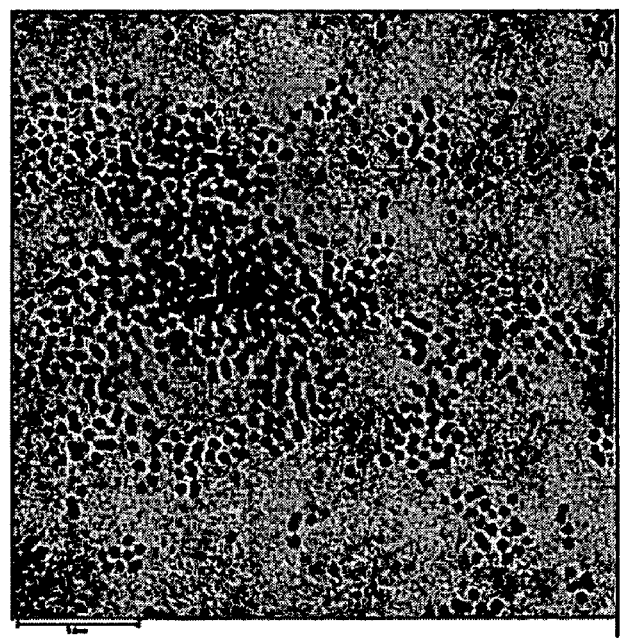

FIGS. 9 and 10 are SEM photographs showing the arrangement of palladium (Pd) nanocrystals that are capped with oleyl amine and spin-coated on a surface of a first tunneling oxide layer formed of hafnium oxide $HfO_2$.

Referring to FIGS. 9 and 10, the palladium (Pd) nanocrystals capped with oleyl amine are directly spin-coated on a hydrophobic tunneling oxide layer (e.g., a hafnium oxide $HfO_2$ layer) making it difficult to obtain a more uniform arrangement because of agglomeration of nanocrystals.

The amino organic silane layer is formed of an amino organic silane compound represented by Formula (1):

FORMULA (1)

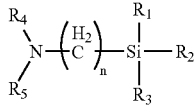

wherein $R_1$, $R_2$, and $R_3$ are each independently a hydrogen atom, a halogen atom, a $C_{1-5}$ alkyl or a $C_{1-5}$ alkoxy group, and at least one of $R_1$, $R_2$ and $R_3$ is a halogen atom or a $C_{1-5}$ alkoxy group; $R_4$ and $R_5$ are each independently a hydrogen atom, $NH_2CH_2$—$(NHCH_2CH_2)_x$—, an aliphatic alkyl group containing at least one nitrogen atom or a cycloalkyl group containing at least one nitrogen atom, where x is an integer from 0 to 10; and n is an integer from 3 to 20.

The second tunneling oxide layer 23 may be formed of $Al_2O_3$, $SiO_2$, $SiO_xN_y$ wherein the expression $2x+3y=4$ is satisfied, silicate of a lanthanoid or transition metal (e.g., hafnium Hf or zirconium Zr) and/or aluminate of a lanthanoid or transition metal. The second tunneling oxide layer 23 may be formed of any material well-known in the art that may be used as an oxide layer and is more reactive to the aminosilane than the material used to form the first tunneling oxide layer 21. The second tunneling oxide layer 23 may have a thickness of about 0.5 nm-2 nm.

According to example embodiments, tunneling is occurs in the second tunneling oxide layer 23, which is a hydrophilic tunneling oxide layer. If the thickness of the second tunneling oxide layer 23 is over 2 nm, then tunneling is difficult to achieve and/or electron transfer to the nanocrystals 27 through the first tunneling oxide layer 21 is interrupted. If the thickness of the second tunneling oxide layer 23 is less than 0.5 nm, then the second tunneling oxide layer 23 is less reactive to the aminosilane than desired.

A water contact angle of the second tunneling oxide layer 23 is less than 50 degrees. If the water contact angle is greater than 50 degrees, uniform coating using a wet method (e.g., spin coating) is difficult to obtain.

Arranging the nanocrystals 27 as a monolayer increases device characteristics of the memory device. The nanocrystals 27 may be arranged in more uniform intervals. The nanocrystals 27, which are in the colloid state and manufactured using a wet synthesizing process, are easier to manufacture. A wet coating method may be applied thereto.

The type of elements used to form the nanocrystals 27 is not limited. It is easier to obtain nanocrystals 27 having a more uniform size because the size of the nanocrystals 27 may be adjusted and/or the capping molecules may be selected. Because the nanocrystals 27 may be electrostatically charged, agglomeration of the nanocrystals 27 does not occur. The nanocrystals 27 may be arranged (or formed) at more uniform intervals if coated on a desired substrate and/or as a monolayer.

A third tunneling oxide layer (not shown) may be formed between the substrate 11 and the first tunneling oxide layer 21. The third tunneling oxide layer may be formed of silicon dioxide $SiO_2$.

According to example embodiments, if the source region 13 is grounded and a predetermined voltage $V_d$ is applied to the drain region 15 ($V_d>0$), then electrons move from the source region 13 to the drain region 15. If a gate voltage $V_a$ is greater than a drain voltage $V_d$, then electrons move to the memory cell 22. The number of electrons is determined (or affected) by the thickness and/or type of material used to form the first tunneling oxide layer 21 and the second tunneling oxide layer 23. The number of electrons is determined (or affected) by the size and/or type of an inner material of the nanocrystals 27.

If electrons exist in the nanocrystals 27, then other electrons are blocked by the above-described Coulomb blockage (i.e., Coulomb repulsion). If the gate voltage $V_a$ is increased to a desired voltage, then the Coulomb repulsion is overcome and additional electrons may flow into the nanocrystals 27.

In a writing operation of the above-described state, if the gate voltage $V_a$ is "0," then the recording of information occurs because tunneling stops and an electron-storing material and electrons in the nanocrystals 27 combine. If a large amount of electrons are stored, "1" is recorded. If a low amount of electrons are stored by properly adjusting the gate voltage $V_a$, then "0" is recorded.

In a reading operation, if a voltage smaller than the gate voltage $V_a$ is applied to the drain region 15 during the writing operation and the gate voltage $V_a$ is set as "0," then the flow (or lack thereof) of the current of the memory cell 22 is determined by the threshold voltage of the memory cell 22, and "1" or "0" may be read by measuring the drain voltage $V_d$.

In an erasing operation, if the gate voltage $V_a$ is "0," a high voltage is applied to the source region 13 and the drain region 15 is opened, then electrons move to the source region 13, erasing the information of the memory cell 22.

The above-described reading, writing, and erasing operations are applied if the memory device according to example embodiments operates as a read-only memory (ROM).

If the memory device operates as a random access memory (RAM), then the memory cell 22 functions as a capacitor. If the memory cell 22 functions as a capacitor, then a smaller charge is stored in the nanocrystals 27 and/or the charge is more easily lost due to a smaller leakage current. As such, it may be necessary to record again.

If the source region 13 is grounded and a desired voltage is applied to the drain region 15, then electrons move from the source region 13 to the drain region 15. If the gate voltage $V_a$ is higher than the drain voltage $V_d$, then electrons tunnel (or move) to the memory cell 22 and are stored in the nanocrystals 27, recording information.

Operation of the memory device functioning as a RAM is the same as operation of the memory device functioning as a ROM, as described above. The memory device functioning as a RAM differs from the memory device operating as a ROM in that the electrons stored in the RAM are removed if power is no longer supplied because a RAM can only store electrode for a limited amount of time.

Now, a method of manufacturing a memory device according to example embodiments will be described with reference to FIGS. 2A-2F.

FIGS. 2A through 2F are diagrams illustrating cross-sectional views of a method of manufacturing a memory device having a different type of nanocrystals according to example embodiments.

Figure 2A:
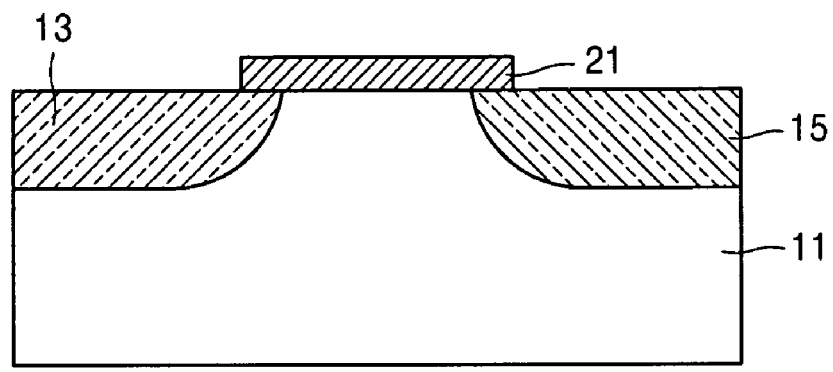
FIGS. 2A through 2F are diagrams illustrating cross-sectional views of a method of manufacturing a memory device according to example embodiments.

Referring to FIG. 2A, memory device 10 is manufactured by forming a source region 13 and a drain region 15 in a silicon substrate 11 and forming a first tunneling oxide layer 21 on a surface of the substrate 11.

The source region 13 and drain region 15 are spaced apart a desired distance from each other. The source region 213 and drain region 15 are formed using conventional semiconductor processes (e.g., ion injection and diffusion).

The first tunneling oxide layer 21 is formed of a material having a higher dielectric constant than a second tunneling oxide layer (described below). The first tunneling oxide layer 21 is formed of a material having a high dielectric constant k of 7 to 100.

The first tunneling oxide layer 21 may be one selected from the group consisting of an oxide of a lanthanoid metal (lanthanum oxide) including $La_2O_3$ and $PrO_2$, an oxide of a transition metal including $HfO_2$, $ZrO_2$, $TiO_2$, $Ta_2O_5$, and an oxide nitride of a transition metal including $HfO_xN_y$ and $ZrO_xN_y$.

A third tunneling oxide layer (not shown) may be formed between the substrate 11 and the first tunneling oxide layer 21. The third tunneling oxide layer may be formed of SiO2.

According to other example embodiments, a tunneling oxide multi-layer structure (not shown) may be formed on a surface of the substrate 11. The multi-layer structure may include the first tunneling oxide layer 21 and the third tunneling oxide layer. The tunneling oxide multi-layer structure is formed of silicon oxide (third tunneling oxide layer)/hafnium oxide (first tunneling oxide layer 21). The tunneling oxide multi-layer structure is formed over the source region 13 and the drain region 15.

Figure 2B:
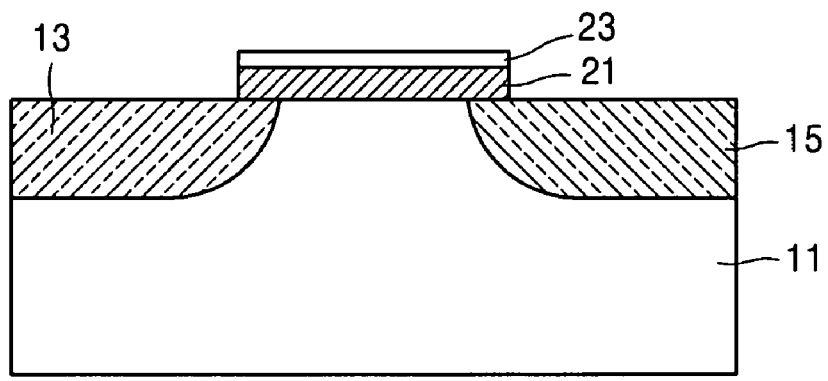

Referring to FIG. 2B, a second tunneling oxide layer 23 is formed on the first tunneling oxide layer 21 or the tunneling oxide multi-layer structure.

The second tunneling oxide layer 23 may be a silicon oxide layer or an aluminum oxide layer. The first tunneling oxide layer 21, third tunneling oxide layer, tunneling oxide multi-layer structure and/or the second tunneling oxide layer 23 may be deposited using an atomic layer deposition method (ALD).

The second tunneling oxide layer may be a silicate ($SiO_2$ or $SiO_xN_y$) or an aluminate ($Al_2O_3$). The second tunneling oxide layer may be a silicate ($SiO_2$ or $SiO_xN_y$) or an aluminate ($Al_2O_3$) of a lanthanoid metal or transition metal (e.g., La, Pr, Hf and Zr), but is not limited thereto. Any material known in the art may be used that reacts easily with an aminosilane group and creates (or induces) electrostatic attraction.

Figure 2C:
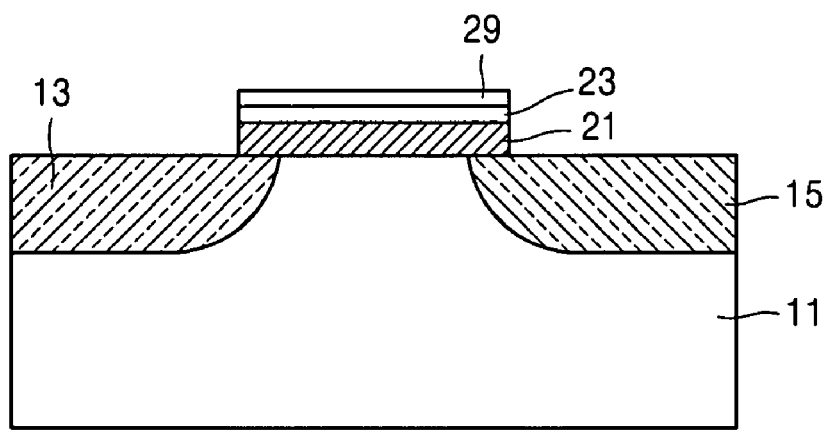

Referring to FIG. 2C, an amino organic silane layer 29 is formed on a surface of the second tunneling oxide layer 23.

The amino organic silane layer 29 may be formed of an amino organic silane represented by Formula (1):

FORMULA (1)

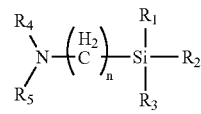

wherein $R_1$, $R_2$, and $R_3$ are each independently a hydrogen atom, a halogen atom, a $C_{1-5}$ alkyl group, or a $C_{1-5}$ alkoxy group, and at least one of $R_1$, $R_2$, and $R_3$ is a halogen atom or a $C_{1-5}$ alkoxy group; $R_4$ and $R_5$ are each independently a hydrogen atom, $NH_2CH_2CH_2-(NHCH_2CH_2)_x-$, an aliphatic alkyl group including at least one nitrogen atom, or a cycloalkyl group including at least one nitrogen atom, where x is an integer from 0 to 10, and n is an integer from 3 to 20.

The amino organic silane layer 29 functions as a temporary supporting layer providing electrostatic attraction to more uniformly arrange the nanocrystals. For example, if an amino group of aminopropyltriethoxysilane is charged positively and the surface of the nanocrystals is capped with negatively charged molecules, then the nanocrystals are formed as a monolayer on the surface of aminopropyltriethoxysilane due to electrostatic attraction.

According to example embodiments, tunneling occurs in the second tunneling oxide layer. If the second tunneling oxide layer has a thickness greater than 2 nm, the transfer of electrons are blocked from being transferred to the nanocrystals through the second tunneling oxide layer is blocked because tunneling is difficult to achieve. If the second tunneling oxide layer has thickness of less than 0.5 nm, a desired reaction with an amino silane group (discussed below) is difficult to obtain.

A water contact angle of the second tunneling oxide layer may be less than 50 degrees. The water contact angle is measured on the surface of the second tunneling oxide layer. The water contact angle is represented by Equation (1):

$$\gamma_{SV} = \gamma_{SW} + \gamma_{WV} \cos \theta \qquad \text{EQUATION (1)}$$

wherein $\gamma_{SV}$ is the interface tension of the second tunneling oxide layer with respect to the air (surface tension), $\gamma_{SW}$ is interface tension of the second tunneling oxide layer with respect to the water, $\gamma_{WV}$ is surface tension of water, and $\theta$ is the water contact angle between the second tunneling oxide layer and the water.

The difference between $\gamma_{SV}$ and the $\gamma_{SW}$ can be obtained when measuring the contact angle because the surface tension of the water $\gamma_{WV}$ is 72.5 dynes/cm at an ambient temperature. As the difference between the interface tension values increases, the smaller the contact angle and the more hydrophilic the second tunneling oxide layer. As the difference between the interface tension values decreases, the larger the water contact angle and the more hydrophobic the second tunneling oxide layer. As such, as the smaller the water contact angle decreases, the reactivity to the aminosilane group increases.

Figure 2D:
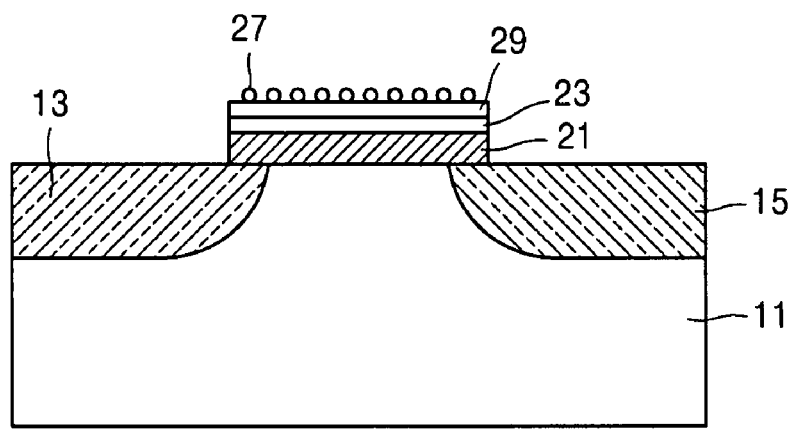

Referring to FIG. 2D, a nanocrystal solution, which is in the colloid state and charged with negative charges, is coated on a surface of the amino organic silane layer 29 using a wet process (e.g., spin-coating), forming a monolayer of nanocrystals 27.

The nanocrystals 27 are capped with organic molecules. If the nanocrystals are synthesized using a wet method, then the nanocrystals 27 are capped with organic molecules having a desired substitution group.

Various organic molecules may be used. An organic molecule may include two functional groups wherein one functional group is bonded to the nanocrystal 27. The other functional group bonded on another end of the nanocrystal 27 is usually a polar group, increasing dispersibility to polar solvents. The nanocrystals 27 are in a dispersed state in polar solvents. Polar solvents induce electrostatic attraction.

Examples of the functional groups are phosphine oxide, phosphonic acid, carboxylic acid, amine, thiol, etc. The polar functional group may be any material having a polarity with positive or negative charges. The polar functional group may be positioned within a molecule (e.g., polyethylene glycol).

The nanocrystals 27 may be arranged (or formed) on the amino organic silane layer 29 using a wet method (e.g., spin-coating, dip coating, drop casting, etc.), but is not limited thereto. Any wet method may be used wherein the nanocrystals 27 are formed having a substantially large size and/or as a monolayer.

The nanocrystals 27 may be selected from the group consisting of metal nanoparticles including Pt, Pd, Co, Cu, Mo, Ni, Fe; Group II-VI compound semiconductor nanoparticles including CdS, CdSe, CdTe, ZnS, ZnSe, ZnTe, HgS, HgSe HgTe; Group III-V compound semiconductor nanoparticles including GaN, GaP, GaAs, InP InAs; and Group IV-VI compound semiconductor nanoparticles including PbS, PbSe, PbTe. The nanocrystals 27 are formed of a metal or alloy. The nanocrystals 27 have or a core-shell structure or a size of 10 nm or less.

The nanocrystals 27 are arranged (or formed) as a monolayer. The interval between the nanocrystals 27 may be uniform. If the nanocrystals are arranged (or formed) as a monolayer, then the voltage needed for the electrons to be transferred to the nanocrystals 27 is reduced and/or the time required for electron transfer decreases, forming a more highly integrated memory device.

Figure 2E:
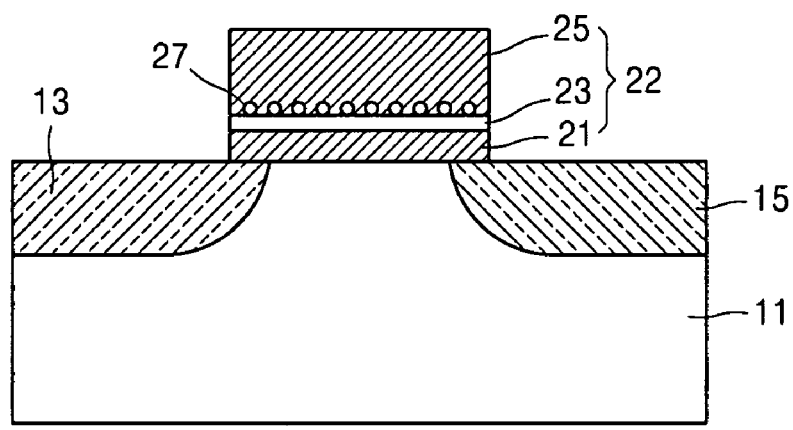

Referring to FIG. 2E, a control oxide layer 25 is formed on a surface of the second tunneling oxide layer 23 and over nanocrystals 27. The control oxide layer 25 may be a hafnium oxide layer.

Figure 2F:
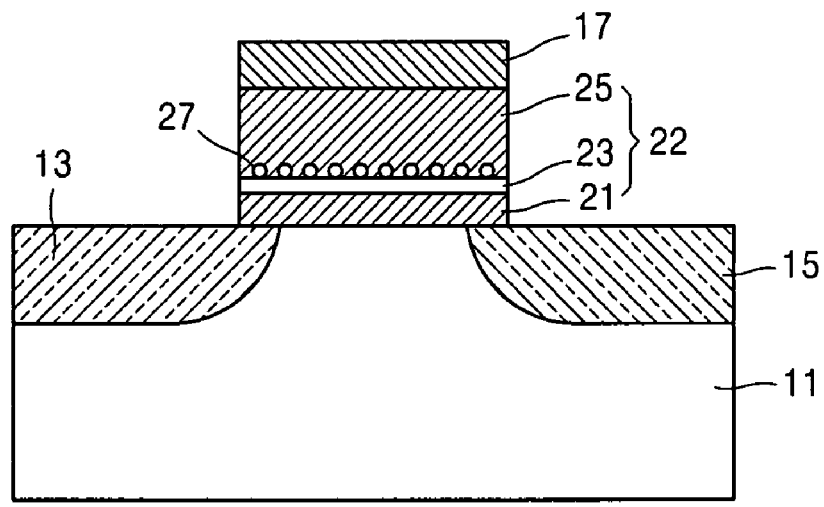

Referring to FIG. 2F, a control gate 17 is formed on the control oxide layer 25.

FIGS. 3A through 3G are diagrams illustrating cross-sectional views of a method of manufacturing a memory device according to example embodiments.

Figure 3A:
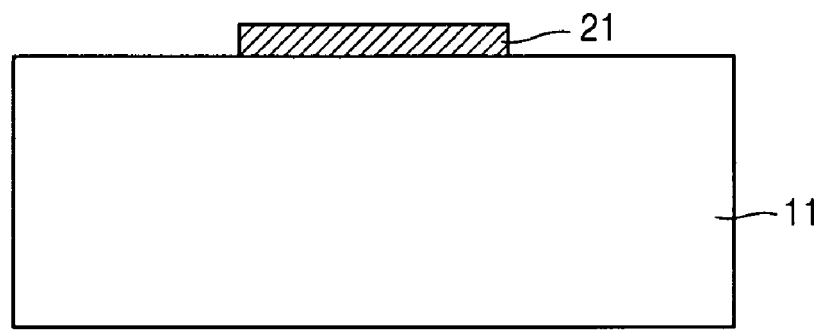
FIGS. 3A through 3G are diagrams illustrating cross-sectional views of a method of manufacturing a memory device according to example embodiments.
Figure 3B:
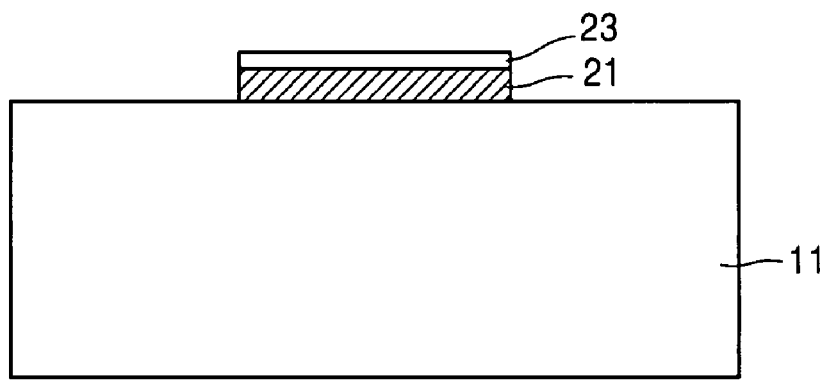
Figure 3C:
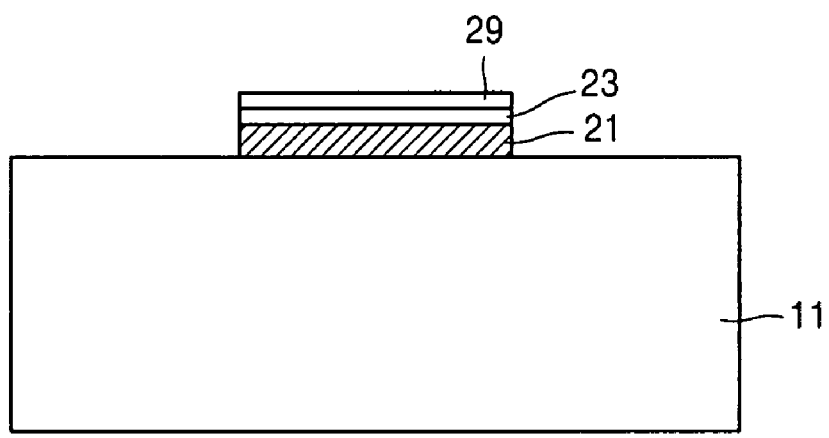
Figure 3D:
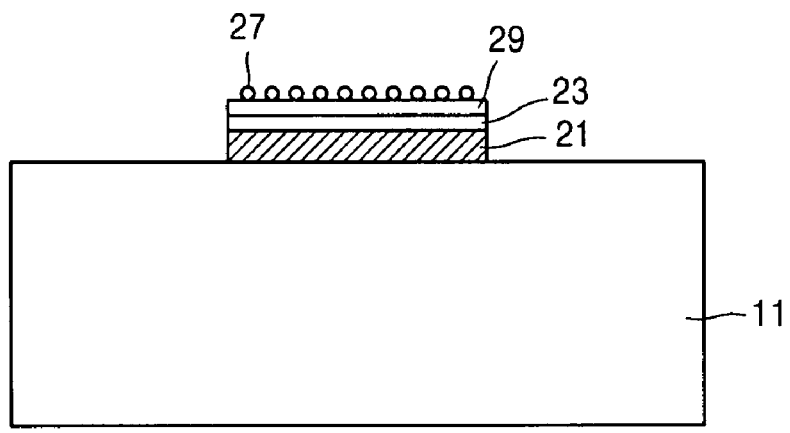
Figure 3E:
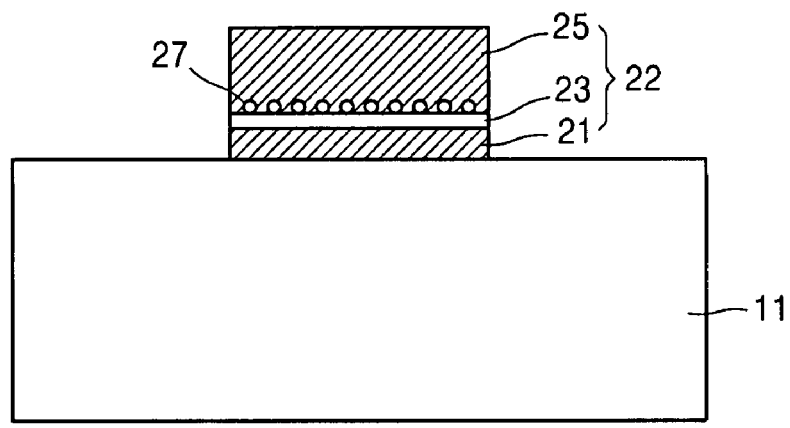
Figure 3F:
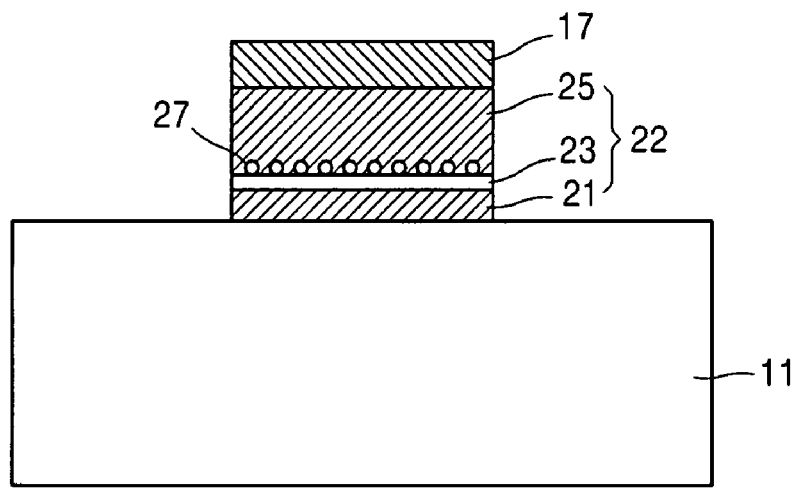
Figure 3G:
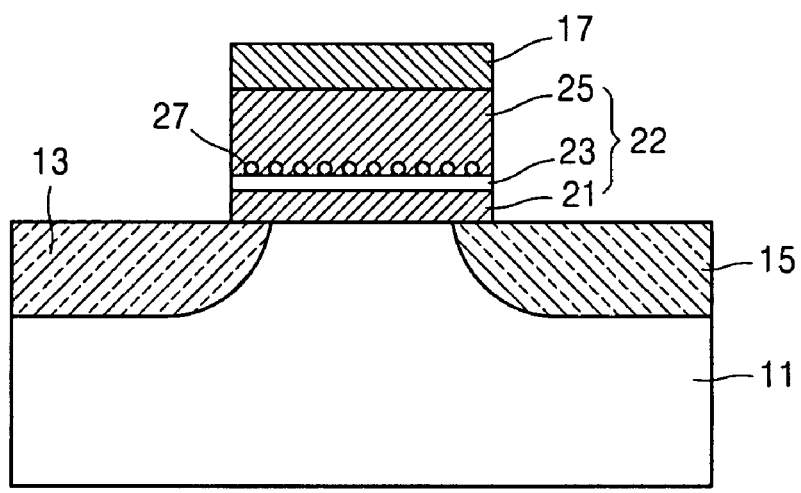

Referring to FIGS. 3A and 3B, memory device 20 is manufactured in a similar manner as memory device 10 except a source region 13 and the drain region 15 are formed after forming the control gate 17 in memory device 20. The source region 13 and the drain region 15 may be formed using semiconductor processes (e.g., ion injection and diffusion).

Hereinafter, the present invention will be described in more detail with reference to the following examples. However, these examples are for illustrative purposes only and are not intended to limit the scope of the invention.

Manufacture of Memory Device

EXAMPLE 1

A silicon substrate was provided. A third tunneling oxide layer was formed on the substrate using thermal oxidization. The third tunneling oxide layer was formed of silicon oxide ($SiO_2$) and having a thickness of 2 nm. A first tunneling oxide layer was formed on the third tunneling oxide layer using an atomic layer deposition (ALD) process. The first tunneling oxide layer was formed of hafnium oxide ($HfO_2$) and having a thickness of 5 nm. The third tunneling oxide layer was formed at a temperature of 1000° C. using an oxygen $O_2$ reaction gas. During the formation of the first tunneling oxide, the deposition temperature layer was 200 or 350° C. The hafnium source gas was tetrakisethylmethylamide (Hf-TEMA). Oxygen $O_2$ or water $H_2O$ was used as the reaction gas.

The $HfO_2$ layer was deposited by sequentially performing a source gas flow operation, a purge operation, a reaction gas flow operation and a purge operation. Deposition was repeated until a layer with a desired thickness was obtained.

A second tunneling oxide layer was formed by depositing an $Al_2O_3$ layer having a thickness of 1 nm on the surface of the first tunneling oxide layer using the ALD method. Trimethyl aluminum (TMA) was used as the aluminum Al source gas and water $H_2O$ was used as the reaction gas during the deposition of the $Al_2O_3$ layer.

The silicon substrate, on which the $Al_2O_3$ layer was deposited, was reacted in a 5 vol % aminopropylmethyldietoxysilane/toluene solution to form an aminopropylsilane layer on the second tunneling oxide layer.

A nanocrystal monolayer was formed on the surface of the aminopropylsilane layer by spin-coating a pH 8 buffer solution at 3000 rpm. Palladium Pd nanocrystals having a negative charged were dispersed in the nanocrystal monolayer.

A colloid solution containing the palladium Pd nanocrystals, which had a diameter of 5 nm and were capped with a mercaptoacetic acid, was used to form the monolayer.

A hafnium oxide layer was deposited to a thickness of 30 nm under similar conditions as described above.

A control gate was stacked on the hafnium oxide layer. Impurities were injected to form a source region and a drain region.

EXAMPLE 2

A memory device was manufactured in the same manner as in Example 1 except that $SiO_2$ was used to form the second tunneling oxide layer (instead of $Al_2O_3$). A silicon Si source gas of $SiH_4$ and a reaction gas of oxygen $O_2$ were used during deposition of the third tunneling oxide layer.

COMPARATIVE EXAMPLE 1

A memory device was manufactured in the same manner as in Example 1 except that the second tunneling oxide layer was omitted.

Evaluation of Nanocrystal Arrangement

The nanocrystal arrangements of Example 1, 2 and Comparative Example 1 were measured using a scanning electron microscope (SEM).

Figure 4:
Figure 5:
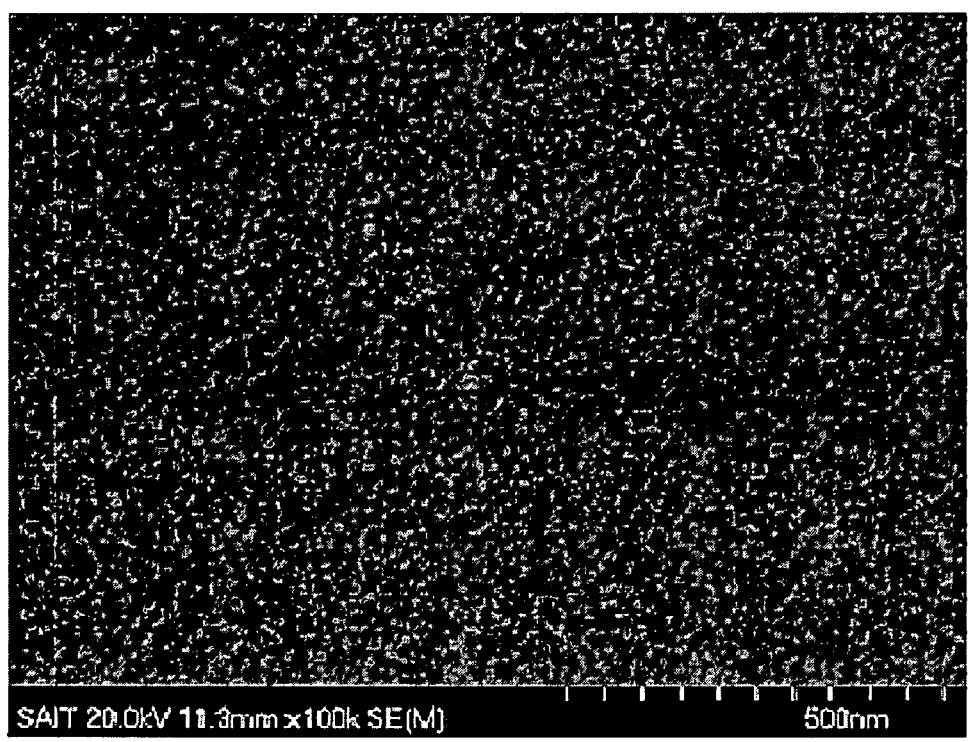
Figure 6:
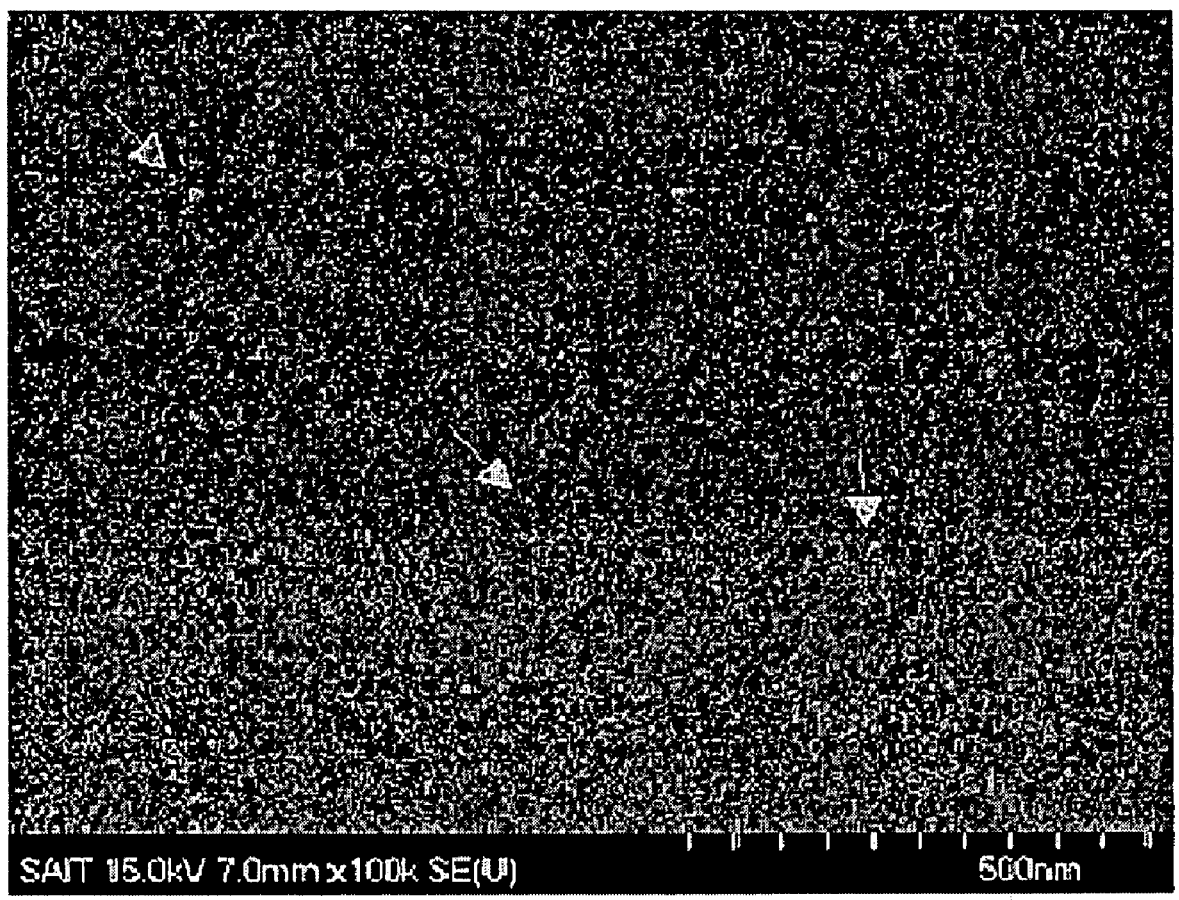

FIG. 4 is a scanning electron microscope (SEM) photograph showing nanocrystals arranged on a surface of the second tunneling oxide layer manufactured according to Example 1. FIG. 5 is a SEM photograph showing nanocrystals arranged on a surface of the second tunneling oxide layer manufactured according to Example 2. FIG. 6 is a SEM photograph showing nanocrystals arranged on a surface of the first tunneling oxide layer manufactured according to Comparative Example 2.

Referring to FIGS. 4 through 6, the nanocrystals in Examples 1 and 2 are denser and more uniformly arranged than the nanocrystals in Comparative Example 1.

Evaluation Memory Device Characteristics

The program and retention characteristics of the memory device manufactured according to Example 1 were measured.

Figure 7:
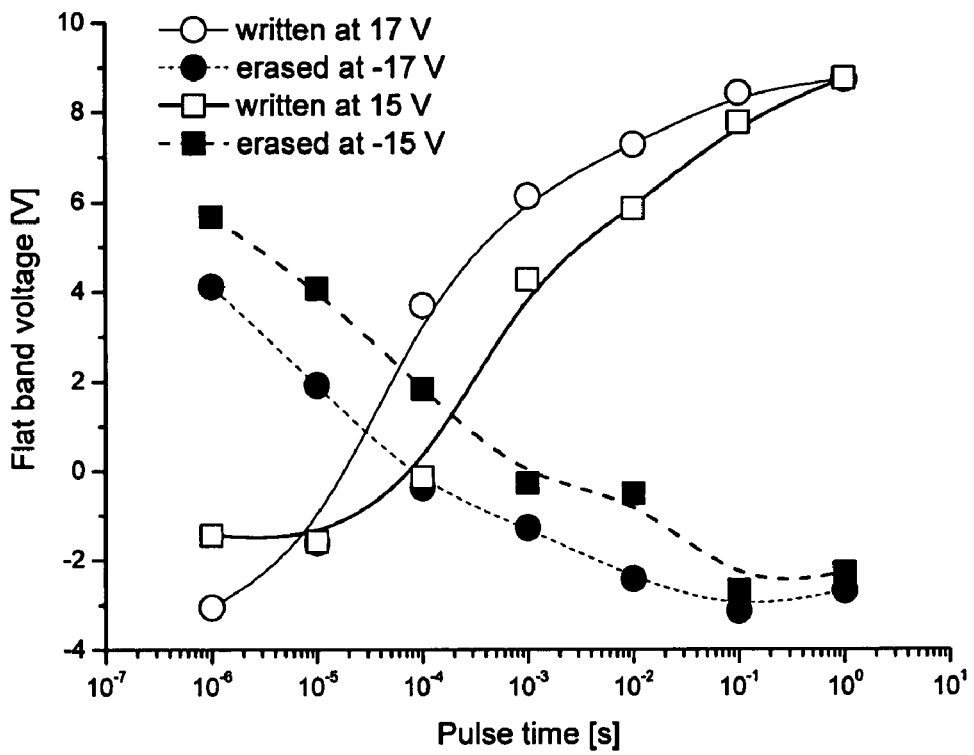

FIG. 7 is a graph illustrating the variation of a flat band voltage VFB according to the programming and erasing time of the memory device manufactured according to Example 1.

Referring to FIG. 7, programming voltages of 17V and 15V and erasing voltages of −17V and −15V were applied to measure the programming time and erasing time of the memory device.

As shown in FIG. 7, the memory device obtains a memory window of about 6V in the range of 100 μs (writing) to 10 msec (erasing). The range of 100 μs to 10 msec is sufficient (or desirable) for programming and erasing. As such, data can be sufficiently recorded and erased in a shorter time period.

Figure 8:
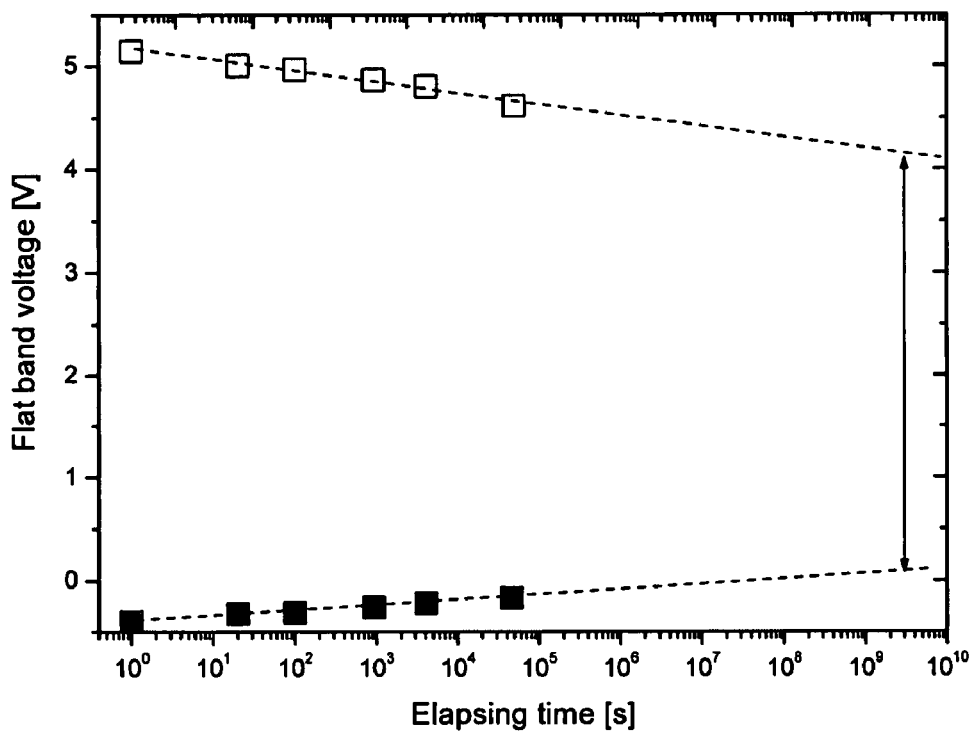

FIG. 8 is a graph showing the predicted data storing time of the memory device manufactured according to Example 1.

Referring to FIG. 8, the difference between the flat band voltages was maintained at 4V after 10 years under the same conditions (e.g., programming speed, erasing speed and voltage) as the memory device in FIG. 7.

Unlike a conventional memory device which is difficult to control due to irregular size and/or arrangement of nanocrystals, a memory device according to example embodiments may include a second tunneling oxide layer having an aminosilane group for electrostatic attraction wherein nanocrystals are arranged as a monolayer. The nanocrystals may be in the form of a colloid. Nanocrystals having various sizes may be more uniformly mixed. As such, characteristics of the memory device according to example embodiments can be controlled. A memory device having increased device characteristics is provided.

In the method of manufacturing a memory device according to example embodiments of the present invention, the interval between the nanocrystals is uniform. Because the nanocrystals are arranged as a monolayer, the voltage and time required to transfer the electrons to the nanocrystals decreases. As such, a more highly integrated memory device is formed. The increased characteristics of the memory device according to example embodiments satisfy the conditions required for the manufacture of a gigabyte memory device.

The memory device according to example embodiments includes a third tunneling oxide layer having an aminosilane layer, enabling a more uniform arrangement of nanocrystals due to electrostatic attraction. As such, the device characteristics of the memory device may increase and be more controllable.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A memory device, comprising:
a source region and a drain region in a substrate, wherein the source and drain region are spaced apart from each other;
a memory cell on a surface of the substrate, wherein the memory cell connects the source region and the drain region and includes a plurality of nanocrystals; and
a control gate on the memory cell;
wherein the memory cell includes a first tunneling oxide layer on the substrate, a second tunneling oxide layer on the first tunneling oxide layer, and a control oxide layer on the second tunneling oxide layer over the nanocrystals,
further comprising an amino organic silane layer on the second tunneling oxide layer,
wherein the amino organic silane layer is formed of an amino organic silane represented by Formula (1):

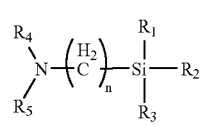

Formula (1)

wherein $R_1$, $R_2$ and $R_3$ are each independently a hydrogen atom, a halogen atom, a $C_{1-5}$ alkyl group or a $C_{1-5}$ alkoxy group, and at least one of $R_1$, $R_2$, and $R_3$ is a halogen atom or a $C_{1-5}$ alkoxy group;
$R_4$ and $R_5$ are each independently a hydrogen atom, $NH_2CH_2CH_2-(NHCH_2CH_2)_x-$, an aliphatic alkyl group including at least one nitrogen atom, or a cyclo alkyl including at least one nitrogen atom, wherein x is an integer from 0 to 10; and
n is an integer from 3 to 20.

2. The memory device of claim 1, wherein the second tunneling oxide layer is formed of at least one material selected from a group consisting of $Al_2O_3$, $SiO_2$, $SiO_xN_y$, ($2x+3y=4$) a silicate of a lanthanoid metal and an aluminate of a lanthanoid metal.

3. The memory device of claim 1, wherein a thickness of the second tunneling oxide layer is 0.5 nm to 2 nm.

4. The memory device of claim 1, wherein a water contact angle of the second tunneling oxide layer is less than 50 degrees.

5. The memory device of claim 1, wherein the first tunneling oxide layer is formed of a material having a higher dielectric constant than the second tunneling oxide layer.

6. The memory device of claim 1, wherein the first tunneling oxide layer is formed of at least one material selected from a group consisting of lanthanum oxide, an oxide of a transition element, silicon lanthanum oxide, lanthanum oxide nitride and an oxide nitride of a transition element.

7. The memory device of claim 1, wherein the first tunneling oxide layer is formed of at least one material selected from a group consisting of $HfO_2$, $ZrO_2$, $HfO_xN_y$(x=yO), $ZrO_xN_y$ (x=yO), $TiO_2$, $Ta_2O_5$, $La_2O_3$ and $PrO_2$.

8. The memory device of claim 1, further comprising a third tunneling oxide layer between the substrate and the first tunneling oxide layer.

9. The memory device of claim 8, wherein the third tunneling oxide layer is formed of $SiO_2$.

10. The memory device of claim 1, wherein the nanocrystals are formed of a metal or alloy.

11. The memory device of claim 10, wherein the nanocrystals are metal nanoparticles including at least one selected from a group consisting of Pt, Pd, Co, Cu, Mo, Ni, Fe, Group II-VI compound semiconductor nanoparticles including CdS, CdSe, CdTe, ZnS, ZnSe, ZnTe, HgS, HgSe, HgTe, Group III-V compound semiconductor nanoparticles including GaN, GaP, GaAs, InP, InAs and Group IV-VI compound semiconductor nanoparticles including PbS, PbSe, PbTe.

12. The memory device of claim 10, wherein the nanocrystals have a core-shell structure or a size of 10 nm or less.

13. The memory device of claim 1, wherein the nanocrystals are arranged as a monolayer.

* * * * *